(12) United States Patent
Foote et al.

(10) Patent No.: US 6,297,143 B1
(45) Date of Patent: Oct. 2, 2001

(54) PROCESS FOR FORMING A BIT-LINE IN A MONOS DEVICE

(75) Inventors: David K. Foote, San Jose; Bharath Rangarajan, Santa Clara; Fei Wang, San Jose; Steven K. Park, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/426,743

(22) Filed: Oct. 25, 1999

(51) Int. Cl.[7] ................................................. H01L 21/4763
(52) U.S. Cl. ........................ 438/618; 438/258; 438/261; 438/266
(58) Field of Search ..................................... 438/618, 258, 438/261, 266

(56) References Cited

U.S. PATENT DOCUMENTS 5,851,881 * 12/1998 Lin et al. .
6,117,730 * 9/2000 Komori et al. .

* cited by examiner

Primary Examiner—Kevin M. Picardat
Assistant Examiner—D. M. Collins
(74) Attorney, Agent, or Firm—Amin & Turocy, LLP

(57) ABSTRACT

A process for fabricating a MONOS device having a buried bit-line includes providing a semiconductor substrate and forming a mask layer overlying the semiconductor substrate. Thereafter, an etch process is performed to form a trench in the semiconductor substrate. Next, the mask layer is removed and the trench in the semiconductor substrate is filled with a silicon oxide layer. To form a bit-line oxide layer, a planarization process is utilized to planarize the silicon oxide layer and form a planar surface continuous with an upper surface of the semiconductor substrate.

17 Claims, 2 Drawing Sheets

PROCESS FOR FORMING A BIT-LINE IN A MONOS DEVICE

CROSS REFERENCE TO RELATED APPLICATIONS

Related subject matter is disclosed in the following co-pending and commonly assigned U.S. patent applications filed on an even date herewith, and are all herein incorporated by reference.

U.S. patent application Ser. No. 09/426,427. "METHOD OF FABRICATING A MONOS FLASH CELL USING SHALLOW TRENCH ISOLATION".

U.S. patent application Ser. No. 09/426,205. "PROCESS FOR FABRICATING A BIT-LINE IN A MONOS DEVICE USING A DUAL LAYER HARD MASK".

U.S. patent application Ser. No. 09/427,402. "INTEGRATED METHOD BY USING HIGH TEMPERATURE OXIDE FOR TOP OXIDE AND PERIPHERY GATE OXIDE".

U.S. patent application Ser. No. 09/427,404. "PROCESS FOR FABRICATING A BIT-LINE USING BURIED DIFFUSION ISOLATION".

FIELD OF THE INVENTION

The invention relates generally to the fabrication of semiconductor devices and, more particularly, to the fabrication of the dielectric layers in semiconductor devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only-memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain.

A Flash device that utilizes the ONO structure is a Metal-Oxide-Nitride-Oxide-Silicon (MONOS) cell. A problem exists with known MONOS cell fabrication techniques in that a thickness of a bit-line oxide layer is difficult to control which causes unpredictable MONOS cell performance. If the thickness of the bit-line oxide layer is not accurately formed, charge cannot be adequately stored within the ONO structure.

A problem occurs in that even a 5 to 10 angstrom variation in the thickness of the ONO structure's lower oxide layer can adversely affect the total amount of implanted arsenic. Thereafter, during the bit-line oxidation process, the amount of implanted arsenic affects the rate of oxidation of the bit-line oxide layer. In particular, a heavily doped arsenic implant enhances the oxidation rate. The variation of the arsenic concentration causes a twenty percent variation, or more, in the thickness of the bit-line oxidation layer. The variation in the bit-line oxidation layer produces unpredictable MONOS cell performance.

Therefore, while recent advances in MONOS cell technology have enabled memory designers to improve MONOS cells, numerous challenges exist in the fabrication of material layers within these devices. In particular, a fabrication process of MONOS cells should accommodate precise control of the thickness of a bit-line oxide layer. Accordingly, advances in MONOS cell fabrication technology are necessary to control bit-line oxide layer fabrication and insure high quality MONOS cell devices.

BRIEF SUMMARY OF THE PREFERRED EMBODIMENTS

Such needs are met or exceeded by the present method for fabricating a MONOS cell. According to an aspect of the present invention a uniform bit-line oxide layer is formed to ensure a desired thickness of the bit-line oxide layer. Therefore, a quality of the MONOS cell is improved.

More specifically, in one form, a process for fabricating a buried bit-line structure for a MONOS cell includes providing a semiconductor substrate and forming mask layer overlying the semiconductor substrate. Thereafter, an etch process is performed to form a trench in the semiconductor substrate. Next, the mask layer is removed and the trench formed in the semiconductor substrate is filled with a silicon oxide layer. To form a bit-line oxide layer, a chemical-mechanical-polishing process is utilized to planarize the silicon oxide layer and form a planar surface continuous with an upper surface of the semiconductor substrate.

BRIEF DESCRIPTION OF THE DRAWINGS

Other features and advantages of the invention will be apparent to those skilled in the art with reference to the detailed description and the drawings, of which.

Figure 1:
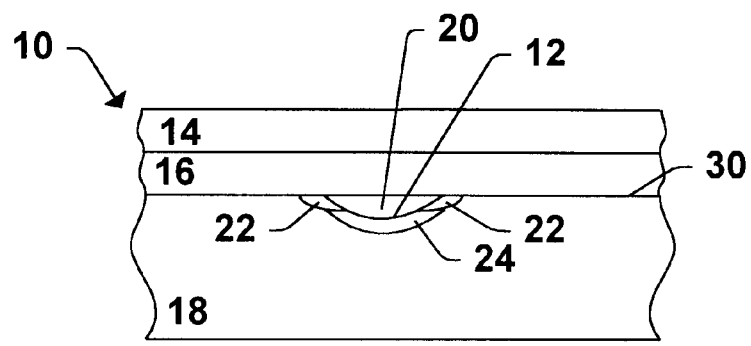
FIG. 1 illustrates, in cross-section, a portion of a semiconductor substrate containing a transistor that incorporates a bit-line oxide layer fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE INVENTION

Referring to FIG. 1, a memory portion of a MONOS cell 10 is shown in cross-section, which can be used in EEPROM and flash type devices. MONOS cell 10 includes at least one buried bit-line 12, a word-line 14, and an ONO structure 16, which function together to determine the location of a charge stored in memory. Bit-line 12 and ONO structure 16 overlie a semiconductor substrate 18. Overlying the buried bit-line 12 is a bit-line oxide layer 20, and also included are boron regions 22 and an arsenic region 24.

Those skilled in the art will recognize that the proper functioning of a MONOS device necessarily requires that an electrical charge is accurately introduced into a silicon nitride layer of the ONO structure 16. In particular, a uniform bit-line oxidation process is necessary to accurately form the bit-line oxide layer 20. In accordance with the invention, a thickness of the bit-line oxide layer 20 is accurately formed. Control of the bit-line oxide layer thickness which is obtained by the present invention can be better understood with the following description of a MONOS fabrication process carried out in accordance with the invention.

Figure 2:
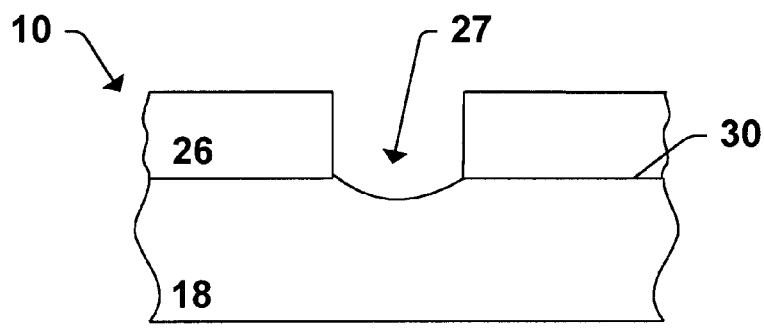
FIGS. 2–5 illustrate, in cross-section, process steps for the fabrication of a buried bit-line structure in accordance with the invention.

Referring now to FIG. 2, according to a preferred embodiment of the present invention, to form a mask, a resist layer 26 is formed to overlie the semiconductor substrate 18. Alternatively, resist layer 26 can be formed to overlie a thin oxide layer (not shown), which overlies semiconductor substrate 18. Those skilled in the art will appreciate that other materials may be used to form the mask so long as the material can be stripped without damaging semiconductor substrate 18.

After forming resist layer 26, semiconductor substrate 18 is etched. Preferably, a shallow trench isolation (STI) etch is utilized to form a trench 27 in semiconductor substrate 18 for buried bit-line region 12. Preferably, trench 27 has a depth of at least about 700 angstroms, and, more preferably, about 1000 angstroms, in semiconductor substrate 18. Those skilled in the art will appreciate that the trench 27 should be deep enough so that bit-line oxide layer 20 sufficiently isolates word-line 14 from buried bit-line region 12. In addition, other etching processes can be used to fill the trench, such as a plasma etch process, an electron cyclotron etch process and the like.

Figure 3:
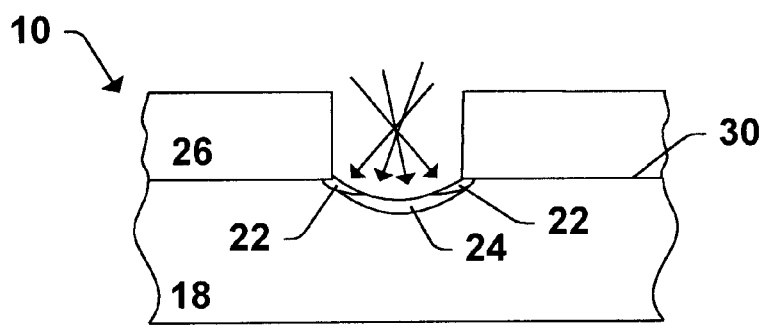

Referring to FIG. 3, to further form the buried bit-line region 12, boron and arsenic are implanted into semiconductor substrate 18, which forms boron regions 22 and arsenic region 24 respectively. The boron is implanted at a high angle, typically about twenty-five degrees to form boron regions 22. In addition, arsenic is implanted at a low angle, typically about zero to about seven degrees, to form arsenic region 24. Those skilled in the art will appreciate that other angles can be used so long as the semiconductor substrate 18 is sufficiently doped after the implant process.

Figure 4:
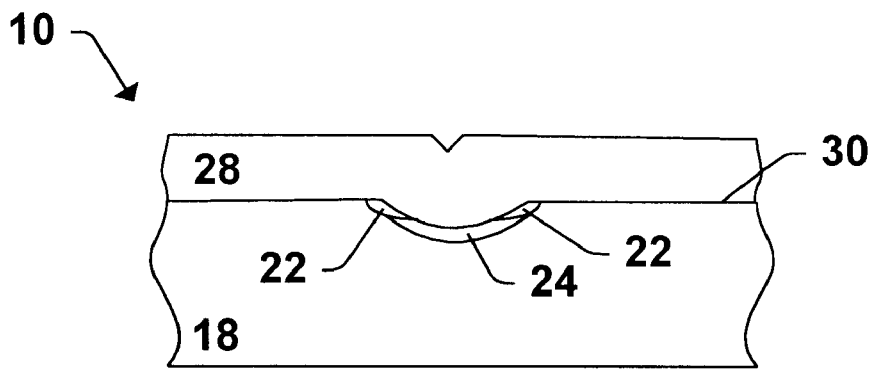

Referring to FIG. 4, after the boron and the arsenic are implanted, silicon dioxide preferably is deposited to form silicon oxide layer 28 to overfill the trench formed by the shallow trench isolation process. For example, the trench is filled using the plasma-enhanced-chemical-vapor-deposition (PECVD) process carried out at a temperature of about 400° C. The process typically is carried out with a mixture of ozone and tetra-ethyl-ortho-silane (TEOS) gas, for a period of time sufficient to overfill the trench with silicon oxide. Those skilled in the art will appreciate that silicon oxide layer 28 can be deposited by other processes, such as a low-pressure-chemical-vapor-deposition (LPCVD) process, a selective deposition process, a molecular beam deposition process, a high-density-plasma (HDP) deposition process, and the like.

Figure 5:
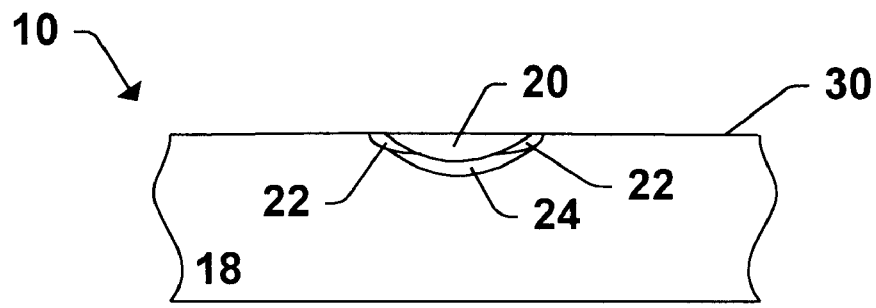

Referring to FIG. 5, after the silicon oxide layer 28 is formed, to form the bit-line oxide layer 20, a planarization process is carried out to remove portions of silicon oxide layer 28 overlying upper surface 30 of semiconductor substrate 18. Preferably a chemical-mechanical-polishing (CMP) process is used to planarize silicon oxide layer 28 and to form a continuous surface with upper surface 30 of semiconductor substrate 18. Alternatively, a planarization etch process can be used to remove portions of silicon oxide layer 28. Thus, according to the preferred embodiment of the present invention, by forming the bit-line oxidation layer 20, and utilizing a planarization process, a bit-line layer 20 is formed having a thickness substantially similar to the depth of the trench 27.

Referring again to FIG. 1, the MONOS cell device is further completed by forming an ONO structure 16 to overlie semiconductor substrate 18. Thereafter, those skilled in the art will appreciate that polycrystalline silicon layer 14 is formed to overlie the top oxide layer of ONO structure 16, and bit-line oxide layer 20. The polycrystalline silicon layer 14 is deposited, for example, by the LPCVD process. Thereafter, the MONOS cell processing continues in a manner known in the art.

From the foregoing description, it should be understood that an improved method of generating a MONOS cell has been shown and described which has many desirable attributes and advantages. According to the above described embodiments, a thickness of the bit-line oxide layer is ensured. Therefore, a quality of the MONOS cell is improved.

Those skilled in the art will recognize that changes and modifications to the embodiments described above can be accomplished, and are contemplated by the present invention. It is therefore intended that the foregoing detailed description be regarded as illustrative rather than limiting, and that it be understood that it is the following claims, including all equivalents, that are intended to define the spirit and scope of this invention.

What is claimed is:

1. A process for fabricating a buried bit-line for a MONOS device, the process comprising the steps of:
    providing a semiconductor substrate, said semiconductor substrate having an upper surface;
    forming a mask layer overlying said semiconductor substrate;
    performing an etch process to form a trench in said semiconductor substrate;
    forming the buried bit-line within the semiconductor substrate below the trench;
    removing said mask layer;
    filling said trench in said semiconductor substrate with a silicon oxide layer; and
    performing a chemical-mechanical-polishing process to planarize said silicon oxide layer and to form a planar surface continuous with said upper surface of said semiconductor substrate, wherein said planarized silicon oxide layer functions as a bit-line oxide layer and is positioned over the buried bit-line.

2. The process of claim 1 further comprising the steps of:
    depositing an ONO structure to overlie said semiconductor substrate; and
    depositing a polycrystalline silicon layer to overlie said ONO structure.

3. The process of claim 1, wherein forming the buried bit-line comprises implanting boron and arsenic into the semiconductor substrate.

4. The process of claim 1, wherein the step of performing an etch comprises utilizing a shallow trench isolation process.

5. The process of claim 1, wherein the step of performing an etch comprises utilizing a plasma etch process.

6. The process of claim 1, wherein said trench in said semiconductor substrate formed during said step of etching has a depth in said semiconductor substrate of at least about 700 angstroms.

7. The process of claim 1, wherein the step of filling said trench comprises using a plasma-enhanced-chemical-vapor-deposition process carried out for a time sufficient to fill said trench.

8. The process of claim 1, wherein the step of filling said trench comprises using a low-pressure-chemical-vapor-deposition process.

9. The process of claim 1, wherein the step of filling said trench comprises utilizing a high-density-plasma process.

10. A process for fabricating a MONOS device including a buried bit-line, the process comprising the steps of:

providing a semiconductor substrate having at least one bit-line oxide layer;

forming the buried bit-line by first, forming a mask layer and performing an etch process to form a trench in said semiconductor substrate and implanting arsenic into the semiconductor substrate below the trench, second, removing said mask layer, third, filling said trench in said semiconductor substrate with a silicon oxide layer, and fourth, performing a chemical-mechanical-polishing process to planarize said silicon oxide layer and forming a planar surface continuous with said upper surface of said semiconductor substrate, wherein said planarized silicon oxide layer comprises a bit-line oxide layer and is positioned over the buried bit-line; and depositing an ONO structure to overlie said semiconductor substrate.

11. The process of claim 10, wherein forming the buried bit-line further comprises implanting boron into the semiconductor substrate.

12. The process of claim 10, wherein the step of performing an etch comprises utilizing a shallow trench isolation process.

13. The process of claim 10, wherein the step of performing an etch comprises utilizing a plasma etch process.

14. The process of claim 10, wherein said trench in said semiconductor substrate formed during said step of etching has a depth in said semiconductor substrate of at least about 700 angstroms.

15. The process of claim 10, wherein the step of filling said trench comprises using a plasma-enhanced-chemical-vapor-deposition process carried out for a time sufficient to fill said trench.

16. The process of claim 10, wherein the step of filling said trench comprises using a low-pressure-chemical-vapor-deposition process.

17. The process of claim 10, wherein the step of filling said trench comprises utilizing a high-density-plasma deposition process.

* * * * *